United States Patent
Lee et al.

(10) Patent No.: US 8,574,792 B2
(45) Date of Patent: Nov. 5, 2013

(54) PHOTOMASK INCLUDING SUPER LENS AND MANUFACTURING METHOD THEREOF

(75) Inventors: Jong Kwang Lee, Daejeon Metropolitan (KR); Jin Ho Ju, Seoul (KR); Min Kang, Seoul (KR); Hyang-Shik Kong, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 204 days.

(21) Appl. No.: 13/110,024

(22) Filed: May 18, 2011

(65) Prior Publication Data

US 2012/0156594 A1    Jun. 21, 2012

(30) Foreign Application Priority Data

Dec. 16, 2010 (KR) ........................ 10-2010-0129284

(51) Int. Cl.
  *G03F 1/00* (2012.01)
(52) U.S. Cl.
  USPC .................................................. 430/5
(58) Field of Classification Search
  USPC ................... 430/5, 321; 355/78, 80
  See application file for complete search history.

(56) References Cited

U.S. PATENT DOCUMENTS

| | | | |
|---|---|---|---|
| 7,538,858 B2 | 5/2009 | Mackey | |
| 2007/0159617 A1* | 7/2007 | Mackey | 355/80 |
| 2010/0033701 A1 | 2/2010 | Lee et al. | |
| 2011/0188032 A1* | 8/2011 | Verma et al. | 356/237.2 |

OTHER PUBLICATIONS

J.B. Pendry, 2000, "Negative refraction makes a perfect lens", Physical review letters, vol. 85, No. 18, pp. 3966-3969.
Nicholas Fang, Hyesog Lee, Cheng Sun, Xiang Zhang, 2005,"Sub-diffraction-limited optical imaging with a siver superlens", Science, vol. 308, pp. 534-537.
Zhaowei Liu et al., 2007, "Far-field optical superlens", Nano letter, vol. 7, No. 2, pp. 403-408.
Xiang Zhang and Zhaowei Liu, 2008, "Superlenses to overcome the diffraction limit", Nature materials, vol. 7, pp. 435-441.
Richard J. Blaikie, David O.S. Melville, Maan M. Alkaisis, 2006, "Super-resolution near-field lithography using planar silver lenses: A review of recent developments", Microelectronic Engineering, vol. 83, 723-729.
D.O.S. Melville, R.J. Blaikie, M.M. Alkaisi 2006, "A comparison of near-field lithography and planar lens lithography", Current Applied Physics, vol. 6, pp. 415-418.

* cited by examiner

*Primary Examiner* — Stephen Rosasco
(74) *Attorney, Agent, or Firm* — Cantor Colburn LLP

(57) ABSTRACT

A photomask includes a substrate, a mask pattern layer and a super lens. The substrate includes a pattern which includes protruding portions, and open portions between the protruding portions. The mask pattern layer is in the open portions of the pattern and fills the open portions of the pattern. The super lens is on the substrate and the mask pattern layer.

16 Claims, 5 Drawing Sheets

PHOTOMASK INCLUDING SUPER LENS AND MANUFACTURING METHOD THEREOF

This application claims priority to Korean Patent Application No. 10-2010-0129284 filed on Dec. 16, 2010, and all the benefits accruing therefrom under 35 U.S.C. §119, the entire contents of which are incorporated herein by reference.

BACKGROUND OF THE INVENTION (1) Field of the Invention

The present invention relates to a photomask including a super lens and a manufacturing method thereof.

(2) Description of the Related Art

Manufacturing processes of several semiconductor devices or display devices include depositing a material, which is an object to be etched, such as a metal on a substrate, applying a photosensitive film (or photoresist film) thereonto, and exposing and developing the applied film in order to form desired final multiple patterned layers stacked on the substrate. In an exposing operation of a manufacturing process, ultraviolet rays, etc. are radiated onto the photosensitive film using a light exposure and a photomask to form a desired pattern shape of the photosensitive film.

Due to a diffraction limit of the light exposure, its resolution is limited to approximately half of wavelength of light used in exposure, e.g., transmitting light. Therefore, a degree of precision of the light exposure is limited, and a fine precision of a desired pattern cannot be achieved.

The above information disclosed in this Background section is only for enhancement of understanding of the background of the invention and therefore it may contain information that does not form the prior art that is already known in this country to a person of ordinary skill in the art.

BRIEF SUMMARY OF THE INVENTION

The present invention provides a photomask including a super lens and a manufacturing method thereof, having advantages of manufacturing a fine pattern having a high resolution by a photolithography process using the photomask including the super lens.

Further, the present invention provides a photomask including a far-field super lens so that performance of the super lens included in the photomask can be improved, and the manufacturing process can be simplified.

An exemplary embodiment of the present invention provides a photomask including a substrate including a pattern which includes protruding portions, and open portions between the protruding portions, a mask pattern layer in the open portions of the pattern and filling the open portions of the pattern, and a super lens on the substrate and the mask pattern layer.

In an exemplary embodiment, a first surface formed by distal ends of the protruding portions of the substrate and the mask pattern layer may be substantially flat.

In an exemplary embodiment, the super lens may include a first negative refractive index layer having a negative refractive index.

In an exemplary embodiment, the first negative refractive index layer may include a conductive metal thin film including at least one of silver (Ag), gold (Au) and aluminum (Al).

In an exemplary embodiment, the photomask may further include a first dielectric layer between the super lens and the substrate, and a second dielectric layer, the super lens being between the substrate and the second dielectric layer.

In an exemplary embodiment, at least one of the first dielectric layer and the second dielectric layer may include at least one of polymethylmethacrylate ("PMMA") and silicon oxide.

In an exemplary embodiment, the super lens may further include a first sub-pattern layer on at least one of upper and lower sides the first negative refractive index layer.

In an exemplary embodiment, the super lens may further include a second sub-pattern layer opposing the first sub-pattern layer with respect to the first negative refractive index layer.

Another exemplary embodiment of the present invention provides a photomask including a substrate, a mask pattern layer on the substrate, and a super lens on the substrate and the mask pattern layer. The super lens includes a first negative refractive index layer having a negative refractive index, and a first sub-pattern layer on at least one of upper and lower sides of the first negative refractive index layer.

In an exemplary embodiment, the super lens may further include a second sub-pattern layer opposing the first sub-pattern layer with respect to the first negative refractive index layer.

Yet another exemplary embodiment of the present invention provides a manufacturing method of a photomask, including etching a substrate to form an engraved pattern, forming a mask pattern layer in the engraved pattern, and forming a super lens on the substrate and the mask pattern layer.

In an exemplary embodiment, the forming a mask pattern layer may include depositing a metal in the engraved pattern of the substrate, and polishing a whole surface of the substrate on which the metal is deposited so that the metal remains only in the engraved pattern.

In an exemplary embodiment, the forming a super lens may include stacking a conductive metal thin film on the substrate and the mask pattern layer, to form a first negative refractive index layer of the super lens.

In an exemplary embodiment, the manufacturing method may further include forming a first dielectric layer between the substrate and the super lens, and forming a second dielectric layer, the first negative refractive index layer being between the substrate and the second dielectric layer.

According to the exemplary embodiments of the present invention, since the diffraction limit of a conventional photomask is solved by using the photomask including the super lens, it is possible to enhance the resolution of the light exposer and form a fine pattern having a high resolution in a photolithography process.

Further, since the substrate of the photomask is etched, the mask pattern layer is formed on the etched substrate, the substrate is polished to have a planar surface, and then the super lens is formed on the planar polished substrate, it is possible to improve the flatness of the metal thin film of the super lens and improve the function of the metal thin film as the super lens.

In addition, it is possible to accomplish far-field lithography by using the photomask including a far-field super lens in the manufacturing process of semiconductor devices and the like.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION OF THE INVENTION

Figure 1:
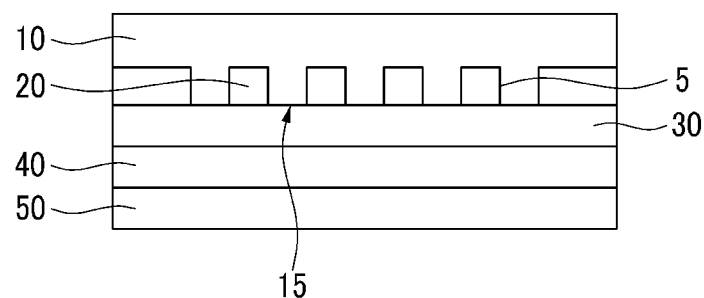
FIG. 1 is a cross-sectional view of an exemplary embodiment of a photomask including a super lens according to the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

First, a photomask including an exemplary embodiment of a super lens according to the present invention will be described with reference to FIG. 1.

FIG. 1 is a cross-sectional view of a photomask including a super lens according to the present invention. A light transmitted through the photomask, for example, to expose a photosensitive or photoresist film, is referred to as a transmitting light.

Referring to FIG. 1, the photomask includes a mask pattern layer 20 in a substrate 10, and a first dielectric layer 30, a negative refractive index layer 40 and a second dielectric layer 50 which are sequentially stacked on the substrate 10 and the mask pattern layer 20.

The substrate 10 may include glass, quartz, or the like and transmits light because of a transparent characteristic of its material. A pattern 5 is on the substrate 10 according to a final desired pattern to form thereby. In an exemplary embodiment, the pattern 5 may be formed by engraving a portion of the substrate 10. The pattern 5 protrudes from a main portion of the substrate 10, and includes open areas (e.g., voids or spaces) between the protruded portions where no material of the pattern 5 or the substrate 10 is in these open areas. The pattern 5 taken collectively with a remaining portion of the substrate 10, forms a single, unitary, indivisible member.

A light-blocking material is filled in the open areas in the engraved pattern 5 of the substrate 10, to collectively form the mask pattern layer 20. The mask pattern layer 20 may include a material such as chromium (Cr) used for a light-blocking film in a general photomask. A first surface 15 of the substrate 10, that is, the surface of a side at which the engraved pattern 5 forming the mask pattern layer 20 is exposed, is entirely flat. As shown in FIG. 1, distal ends of the protruding patterns 5 are aligned to form a portion of the first surface 15, and are substantially coplanar with each other. In this case, a variation of the flatness of the first surface 15 of the substrate 10, which may be the averaged distance between the highest point and the lowest point of the first surface 15, may be in a range from $\frac{1}{100}$ to $\frac{1}{5}$ of a thickness of the first dielectric layer 30 or a thickness of the second dielectric layer 50.

The first dielectric layer 30 and the second dielectric layer 50 may include a dielectric material such as polymethylmethacrylate ("PMMA") or silicon oxide (SiOx), etc. The thickness of the first dielectric layer 30 or the thickness of the second dielectric layer 50 may be in the range from about 1 nanometer (nm) to about 1 micrometer (μm). The refractive index of the first dielectric layer 30 or the refractive index of the second dielectric layer 50 may be similar to that of the negative refractive index layer 40. The first dielectric layer 30 and/or the second dielectric layer 50 may have planar upper and lower surfaces.

Figure 10:
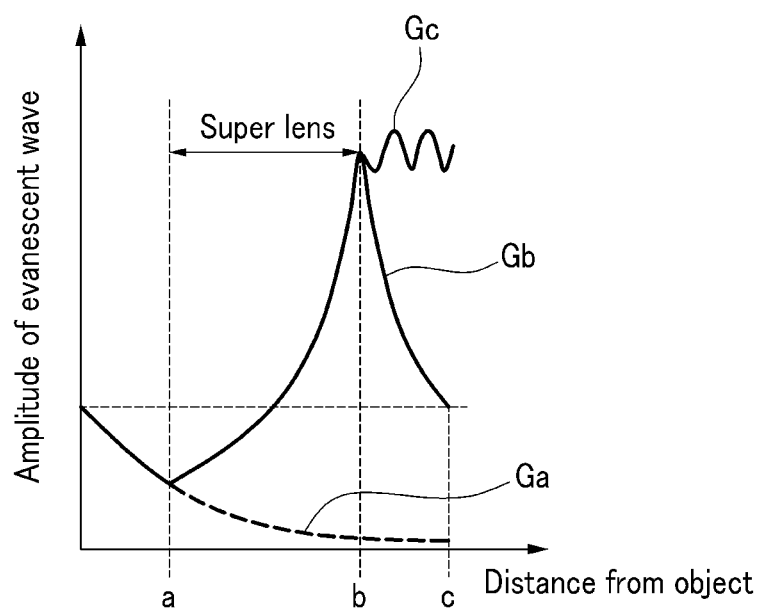
FIG. 10 is a graph showing a characteristic in which an evanescent wave is transmitted in an exemplary embodiment of the super lens according to the present invention and in a general material.

The negative refractive index layer 40 has a negative refractive index. The negative refractive index can be obtained when at least one of the permittivity, $\in$, and permeability $\mu$ is a negative value. The negative refractive index layer 40 may be a substantially planar thin film including a conductive metal of Ag, Au or Al, etc., and a thickness of the thin film may be much smaller than a wavelength of the transmitting light to the extent that permeability $\mu$ of the conductive metal is not of significant effect or is not a consideration. The negative refractive index layer 40 may also include a planar upper surface and a planar lower surface. The negative refractive index layer 40 is referred to a super lens which can amplify an evanescent wave of the transmitting light, to be able to transfer portions of the evanescent wave at a subwavelength level. With reference to FIG. 10, a transfer characteristic of the evanescent wave in the super lens of the exemplary embodiment will be described.

FIG. 10 is a graph showing a characteristic in which the evanescent wave is transferred in an exemplary embodiment a super lens according to the present invention and in a general material. A graph Ga represents an amplitude of the evanescent wave transmitted in the general material, a graph Gb represents an amplitude of the evanescent wave transmitted in the super lens, a graph Gc represents an amplitude of the evanescent wave transmitted in a far-field super lens which is explained later. In FIG. 10, 'a' to 'b' represents regions of the general material or the super lens, and 'c' is a position for measuring information of the evanescent wave.

As shown in FIG. 10, since the amplitude of the evanescent wave passed through the general material is decreased, it is difficult to transfer portions of the evanescent wave at the subwavelength level (e.g., at a wavelength less than wavelength of the transmitting light). However, the evanescent wave passing through the super lens including the negative refractive index layer 40 according to the present invention is amplified as shown by the graph Gb, to thereby make it possible to transfer the portion of the evanescent wave at the subwavelength level. Therefore, it is possible to solve a general diffraction limit which is limited by a half level of wavelength of the transmitting light.

Referring to FIG. 1 again, since the first dielectric layer 30 is directly on the planar first surface 15 of the substrate 10 and has the planar upper surface, and since the lower surface of first dielectric layer 30 is also flat, a substantially planar interface surface between the negative refractive index layer 40 and the first dielectric layer 30 can be further secured, thereby further improving performance of the super lens including the negative refractive index layer 40. Further, the first dielectric layer 30 and the second dielectric layer 50 can improve adhesion with the negative refractive index layer 40 and play a role of supporting the function of the negative refractive index layer 40 as a super lens.

In exemplary embodiments, the photomask including the super lens may be used when forming a fine pattern using a photolithography operation in a manufacturing process of several semiconductor devices or display devices. Since the exemplary embodiment of the photomask according to the present invention can overcome the diffraction limit by including the super lens therein, the resolution of the light exposure can be increased extraordinarily. Thus, it is possible to form a pattern of a general resolution, that is, even including a pattern having a size smaller than a half wavelength of the light used when performing an exposing operation. Thus, it is possible to enhance a definition of a pattern formed using the photomask in a photolithography process, allowing a significant reduction in a size of an electric device such as integrated circuit formed by the pattern.

Hereinafter, an exemplary embodiment of a manufacturing method of the photomask including the super lens shown in FIG. 1 will be described with reference to FIGS. 2 to 6.

FIG. 2, FIG. 3, FIG. 4, FIG. 5 and FIG. 6 are drawings sequentially showing exemplary embodiment of intermediate operations of the manufacturing method of the photomask including the super lens shown in FIG. 1 according to the present invention.

Figure 2:
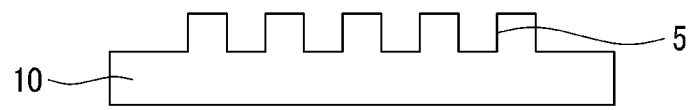
FIG. 2, FIG. 3, FIG. 4, FIG. 5 and FIG. 6 are diagrams sequentially showing exemplary embodiments of intermediate operations of a manufacturing method of the photomask including the super lens shown in FIG. 1 according to the present invention.

First, referring to FIG. 2, the substrate 10 including glass or quartz etc. is prepared and then is etched to form the engraved pattern 5 which has a shape of a desired pattern.

Figure 3:
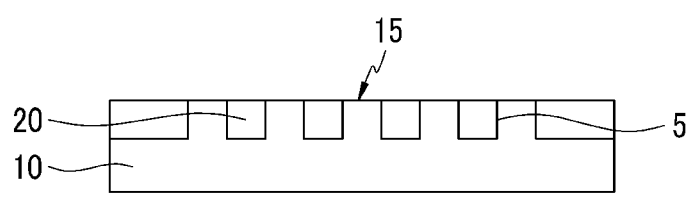

Next, referring to FIG. 3, in the engraved pattern 5, such as in open areas between protrusions of the pattern 5, a metal such as chromium (Cr) is deposited by using scattering, evaporation deposition or plating. The metal is completely filled in the open areas, and the substrate 10 including the engraved pattern 5 and the metal is sintered with metal paste. A whole surface including the metal of the metal-deposited substrate 10 is polished to form a mask pattern layer 20. In this case, the substrate 10 including the engraved pattern 5 and the metal is polished until the mask pattern layer 20 remains only between the protruded portions of the engraved pattern 5, so that a first surface 15 which is the upper surface of the substrate 10 is flattened (e.g., completely planar). The polishing method may include a chemical, mechanical polishing, etc.

Figure 4:
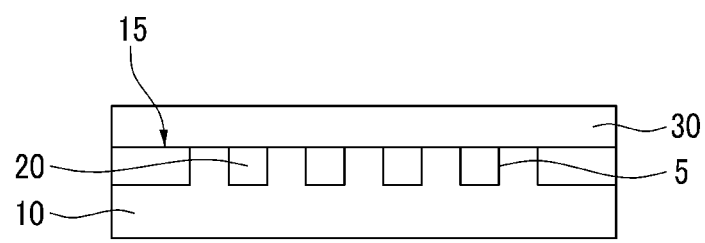

Next, referring to FIG. 4, a first dielectric layer 30 including a dielectric material of PMMA or silicon oxide (SiOx), etc. is deposited directly on the first surface 15 of the polished substrate 10. Since the first dielectric layer 30 is formed directly on the polished planar first surface 15 of substrate 10, the flatness of both upper and lower surfaces of the first dielectric layer 30 can be improved, and a separate processes for flattening the deposited material can be reduced.

Figure 5:
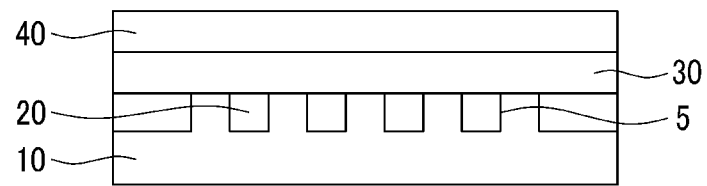

Next, referring to FIG. 5, a conductive metal of Ag, Au or Al, etc. is deposited thinly and directly on the first dielectric layer 30 to form the negative refractive index layer 40. In this case, the thickness of the negative refractive index layer 40 can be controlled to an extent that permeability $\mu$ of the conductive metal is not a significant consideration. Since the negative refractive index layer 40 is formed directly on the flat upper surface of the first dielectric layer 30, the flatness of both upper and lower surfaces of the metal thin film forming the negative refractive index layer 40 can be improved, and the functioning of the negative refractive index layer 40 as a super lens described above can be further improved.

Figure 6:
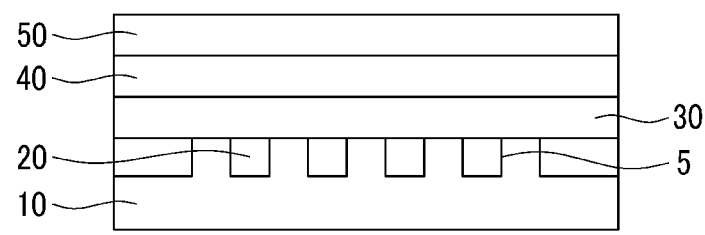

Next, referring to FIG. 6, on the negative refractive index layer 40, a second dielectric layer 50 including a dielectric material of PMMA or silicon oxide, etc. is deposited directly on the planar upper surface of the negative refractive index layer 40, to complete the photomask including the super lens as shown in FIG. 1.

Hereinafter, other exemplary embodiments of a photomask including a super lens according to the present invention will be described with reference to FIG. 7, FIG. 8 and FIG. 9. The same constituent elements as the exemplary embodiment described above use the same reference numerals and the same description is omitted, but hereinafter, differences between embodiments will be described.

Figure 7:
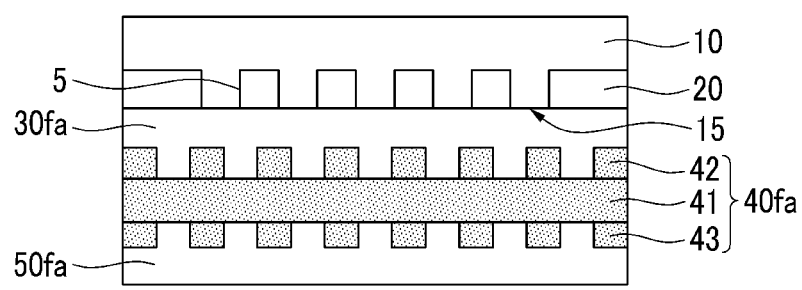
FIG. 7, FIG. 8 and FIG. 9 are cross-sectional views of other exemplary embodiments of a photomask including super lenses according to the present invention.
Figure 8:
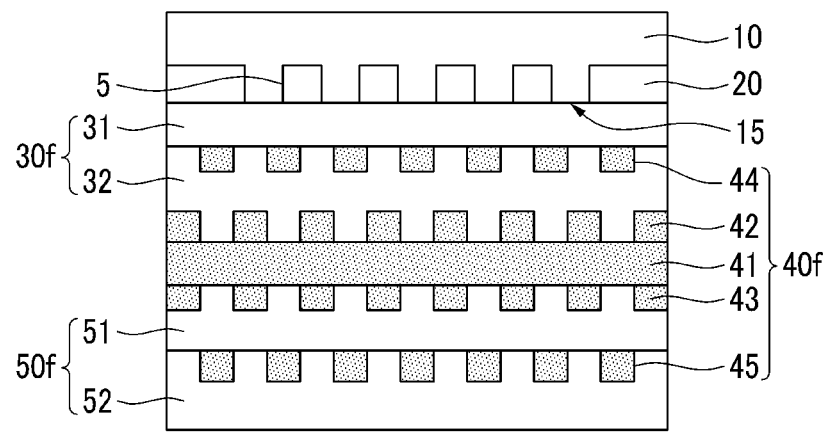
Figure 9:
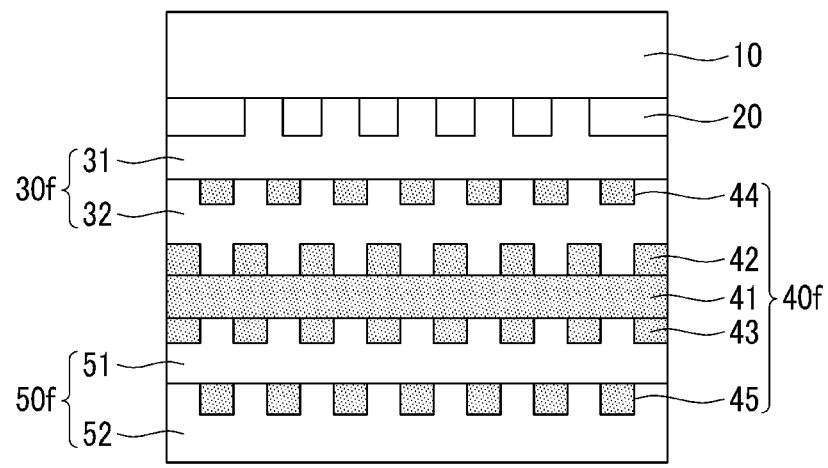

FIG. 7, FIG. 8 and FIG. 9 are cross-sectional views of other exemplary embodiments of photomasks including super lenses according to the present invention, respectively.

First, referring to FIG. 7, the photomask of the illustrated exemplary embodiment is almost the same as the exemplary embodiment shown in FIG. 1, but includes a first dielectric layer 30fa, a negative refractive index layer 40fa, and a second dielectric layer 50fa which each have different structures from FIG. 1.

As in the exemplary embodiment of FIG. 1 described above, the mask pattern layer 20 is within the engraved pattern 5 of substrate 10, and the first surface 15 of the substrate 10 is a flat surface.

The first dielectric layer 30fa, the negative refractive index layer 40fa, and the second dielectric layer 50fa are sequential with respect to the first surface 15 of the substrate 10.

The negative refractive index layer 40fa includes a first sub-negative refractive index layer 41, and a second sub-negative refractive index layer 42 and a third sub-negative refractive index layer 43 on lower and upper surfaces of the first sub-negative refractive index layer 41, respectively. The first sub-negative refractive index layer 41 has an upper surface and a lower surface both of which are flat, such that the negative refractive index layer 40fa includes at least one portion having upper and lower planar surfaces. The second sub-negative refractive index layer 42 and the third sub-negative refractive index layer 43 have a predetermined shape, respectively.

The first dielectric layer 30fa is between the first surface 15 of the substrate 10 and the negative refractive index layer 40fa, and the second dielectric layer 50fa is on a side of the negative refractive index layer 40fa opposed to the first dielectric layer 30fa with respect to the negative refractive index layer 40fa.

In the exemplary embodiment, the negative refractive index layer 40fa constitutes a super lens. The second sub-negative refractive index layer 42 and the third sub-negative refractive index layer 43 constitutes a far-field super lens together with the first sub-negative refractive index layer 41, forming a plurality of flat surfaces. Accordingly, in an exemplary embodiment of a manufacturing method, far-field photolithography may be performed by using the photomask including the super lens according to the illustrated exemplary embodiment. This will be described with reference to FIG. 10.

Referring again to FIG. 10, the graph Gc is the graph showing an amplitude of an evanescent wave passing through the exemplary embodiment of the far-field super lens according to the present invention. Since the evanescent wave passing through the super lens portion of the far-field super lens is amplified in regions a-b of the super lens, even though the evanescent wave deviates from the regions a-b of the super lens, it is transmitted a longer distance together with a transmitted wave without decreasing as in a graph Gb, so that portions of the evanescent wave at the sub-wavelength levels can be effectively transferred. Therefore, when the photomask including the far-field super lens is used in the manufacturing process of semiconductor devices or display devices, far-field photolithography, in which the photomask and the photosensitive film are not in contact and spaced apart from each other, can be performed, and a high resolution or fine pattern can be formed.

Next, a manufacturing method of the photomask including the super lens shown in FIG. 7 will be described.

Like the exemplary embodiment shown in FIGS. 1 to 6, the substrate 10 including glass or quartz, etc. is etched to form the engraved pattern 5, and a metal for the light blocking film such as chromium (Cr) is deposited in open areas of the pattern 5 The whole surface of the substrate 10 where the metal is deposited, is polished to form the mask pattern layer 20.

Next, on the polished substrate 10 and the mask pattern layer 20, the first dielectric layer 30fa including a dielectric material of PMMA, silicon oxide, or the like, is directly deposited and patterned. The patterning of the first dielectric layer 30fa forms a plurality of recesses or depressions in the upper surface thereof.

Next, directly on the first dielectric layer 30fa and in the recesses, the conductive metal of silver (Ag), gold (Au) or aluminum (Al), etc. is deposited. The upper surface of the deposited conductive metal is patterned to form the negative refractive index layer 40fa including the first sub-negative refractive index layer 41, the second sub-negative refractive index layer 42 and the third sub-negative refractive index layer 43.

Lastly, on the negative refractive index layer 40fa, a dielectric material of PMMA or silicon oxide, etc. is deposited to form the second dielectric layer 50fa.

Hereinafter, another exemplary embodiment of a photomask including a super lens according to the present invention will be described with reference to FIG. 8.

The photomask including the super lens shown in FIG. 8 is largely the same as the exemplary embodiment shown in FIG. 7, but a structure of the super lens is different.

Like the exemplary embodiment shown in FIG. 7 described above, the mask pattern layer 20 is in the engraved pattern 5 of substrate 10, and the first surface 15 of the substrate 10 is a flat surface.

The first dielectric layer 30f, the negative refractive index layer 40f and the second dielectric layer 50f are sequential with respect to the first surface 15 of the substrate 10.

The negative refractive index layer 40f includes, as the exemplary embodiment of FIG. 7, the first sub-negative refractive index layer 41, the second sub-negative refractive index layer 42 and the third sub-negative refractive index layer 43 on lower and upper surfaces of the first sub-negative refractive index layer 41, respectively. The negative refractive index layer 40f further includes a fourth sub-negative refractive index layer 44 and a fifth sub-negative refractive index layer 45.

The fourth sub-negative refractive index layer 44 is between the first surface 15 of the substrate 10 and the second sub-negative refractive index layer 42, and faces the second sub-negative refractive index layer 42. The fourth sub-negative refractive index layer 44 may have a pattern shape which alternates with the pattern of the second sub-negative refractive index layer 42. The fifth sub-negative refractive index layer 45 is on the side of the negative refractive index layer 40fa opposed to the fourth sub-negative refractive index layer 44 with respect to the first sub-negative refractive index layer 41, faces the third sub-negative refractive index layer 43, and may have a pattern of shape alternating with the pattern of the third sub-negative refractive index layer 43.

The first dielectric layer 30f includes a first sub-dielectric layer 31 between the first surface 15 of substrate 10 and the fourth sub-negative refractive index layer 44, and a second sub-dielectric layer 32 between the fourth sub-negative refractive index layer 44 and the second sub-negative refractive index layer 42. Further, the second dielectric layer 50f includes a third sub-dielectric layer 51 between the third sub-negative refractive index layer 43 and the fifth sub-negative refractive index layer 45, and a fourth sub-dielectric layer 52 on the fifth sub-negative refractive index layer 45.

The negative refractive index layer 40f of the exemplary embodiment also constitutes also a far-field super lens, and its effect is the same as in FIG. 7 described above.

Next, to describe a manufacturing method of the photomask including the super lens shown in FIG. 8, like in the exemplary embodiment shown in FIG. 1 to FIG. 6, the substrate 10 including glass or quartz, etc. is etched to form the engraved pattern 5, and then a metal for the light blocking film, such as chromium (Cr), is deposited thereon. The whole surface of the substrate 10 where the metal is deposited is polished to form the mask pattern layer 20. Subsequently, on the polished substrate 10 and mask pattern layer 20, the first sub-dielectric layer 31 is directly stacked, and then the conductive metal is deposited and patterned thereon to form the fourth sub-negative refractive index layer 44. Subsequently, on the fourth sub-negative refractive index layer 44, the second sub-dielectric layer 32 is directly deposited and patterned.

Next, on the patterned second sub-dielectric layer 32, the conductive metal is deposited and the upper surface thereof is patterned to form the first sub-negative refractive index layer 41, the second sub-negative refractive index layer 42 and the third sub-negative refractive index layer 43. Subsequently, on the third sub-negative refractive index layer 43, the third sub-dielectric layer 51 is stacked, and the conductive metal is deposited and patterned thereon to form the fifth sub-negative refractive index layer 45.

Lastly, on the fifth sub-negative refractive index layer 45, the fourth sub-dielectric layer 52 is stacked to complete the photomask shown in FIG. 8.

The exemplary embodiment shown in FIG. 9 is largely the same as the exemplary embodiment shown in FIG. 8, but structures of the substrate 10 and the mask pattern layer 20 are different. In the illustrated exemplary embodiment, without patterning of the substrate 10, the mask pattern layer 20 is formed on the substrate 10.

The substrate 10 does not include the pattern 5 as in the other exemplary embodiments. The mask pattern layer 20 is directly on and protrudes from a planar surface of the substrate 10, such that the planar surface is between the substrate 10 and the mask pattern layer 20. The first sub-dielectric layer 31 of the illustrated embodiment, does not include planar upper and lower surfaces, as in the exemplary embodiment of FIG. 8. Instead, portions of the first sub-dielectric layer 31 alternate with portions of the mask pattern 20, as illustrated in FIG. 9.

According to the manufacturing method of the photomask including the super lens shown in FIG. 9, on the planar surface of the substrate 10 including glass or quartz, etc., a metal for light blocking film is directly deposited on a planar surface and patterned to form the mask pattern layer 20. Subsequently, after the first sub-dielectric layer 31 is stacked on the mask pattern layer 20, the upper surface of the first sub-dielectric layer 31 is flattened. Since the next manufacturing method is the same as the manufacturing method of the exemplary embodiment of FIG. 8 described above, the detailed description thereof is omitted.

Several characteristics and effects of the exemplary embodiment of FIGS. 1 to 6 described above may be also applied to the exemplary embodiments shown in FIG. 7, FIG. 8 and FIG. 9.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photomask, comprising:
    a substrate including a main planar portion, protruding portions extending from the main planar portion, and open portions defined between the protruding portions;
    a mask pattern layer in the open portions, wherein the mask pattern layer fills the open portions defined between the protruding portions of the substrate; and
    a super lens on the substrate and the mask pattern layer.

2. The photomask of claim 1, wherein:
    a first surface formed by distal ends of the protruding portions of the substrate, and the mask pattern layer, is substantially planar.

3. The photomask of claim 2, wherein:
    the super lens includes a first negative refractive index layer having a negative refractive index.

4. The photomask of claim 3, wherein:
    the first negative refractive index layer includes a conductive metal thin film including at least one of silver (Ag), gold (Au) and aluminum (Al).

5. The photomask of claim 3, further comprising:
    a first dielectric layer between the super lens and the substrate, and
    a second dielectric layer, the super lens between the substrate and the second dielectric layer.

6. The photomask of claim 5, wherein:
    at least one of the first dielectric layer and the second dielectric layer, includes at least one of polymethylmethacrylate and silicon oxide.

7. The photomask of claim 5, wherein:
    the super lens further includes a first negative refractive index sub-pattern layer on at least one of upper and lower sides of the first negative refractive index layer.

8. The photomask of claim 7, wherein:
    the super lens further includes a second negative refractive index sub-pattern layer opposing the first negative refractive index sub-pattern layer with respect to the first negative refractive index layer.

9. The photomask of claim 1, wherein:
    the super lens includes a first negative refractive index layer having a negative refractive index.

10. The photomask of claim 9, wherein:
    the first negative refractive index layer includes a conductive metal thin film including at least one of silver (Ag), gold (Au), and aluminum (Al).

11. The photomask of claim 9, further comprising:
    a first dielectric layer between the super lens and the substrate, and
    a second dielectric layer, the super lens between the substrate and the second dielectric layer.

12. The photomask of claim 11, wherein:
    at least one of the first dielectric layer and the second dielectric layer, includes at least one of polymethylmethacrylate and silicon oxide.

13. The photomask of claim 9, wherein:
the super lens further includes a first negative refractive index sub-pattern layer on at least one of upper and lower sides of the first negative refractive index layer.

14. The photomask of claim 13, wherein:
the super lens further includes a second negative refractive index sub-pattern layer opposing the first negative refractive index sub-pattern layer with respect to the first negative refractive index layer.

15. A photomask, comprising:
a substrate;
a mask pattern layer on the substrate; and
a super lens disposed on the substrate and the mask pattern layer,
wherein the super lens includes:
   a first negative refractive index layer having a negative refractive index, and comprising planar upper and lower sides, and
   a first negative refractive index sub-pattern layer having a negative refractive index, and comprising protruding portions spaced apart from each other and protruding from one of the planar upper side and the planar lower side of the first negative refractive index layer.

16. The photomask of claim 15, wherein:
the super lens further includes a second negative refractive index sub-pattern layer having a negative refractive index, and comprising protruding portions spaced apart from each other and protruding from the other of the planar upper side and the planar lower side of the first negative refractive index layer.

* * * * *